United States Patent [19]

Hay, III

[11] 4,415,891

[45] Nov. 15, 1983

[54] PROGRAMMABLE SCAN CONTROL CIRCUIT FOR PROVIDING BAR GRAPH DISPLAY PANEL WITH SELECTED SCALES AND MARKER BARS

[75] Inventor: Thomas M. Hay, III, Fort Lauderdale, Fla.

[73] Assignee: Sony Corporation, Tokyo, Japan

[21] Appl. No.: 244,599

[22] Filed: Mar. 17, 1981

[51] Int. Cl.³ .............................................. G09G 3/06
[52] U.S. Cl. .................................. 340/753; 340/805; 340/754; 340/791
[58] Field of Search ............... 340/753, 754, 799, 805, 340/791, 789, 793

[56] References Cited

U.S. PATENT DOCUMENTS

| | | | |
|---|---|---|---|
| Re. 30,172 | 12/1979 | Saxon | 340/753 |
| 3,922,666 | 11/1975 | Inami et al. | 340/753 |
| 4,027,197 | 5/1977 | Coleman | 340/753 |
| 4,155,084 | 5/1979 | Klees | 340/753 |
| 4,240,073 | 12/1980 | Seats et al. | 340/799 |
| 4,253,096 | 2/1981 | Kmetz | 340/753 |

*Primary Examiner*—Marshall M. Curtis
*Attorney, Agent, or Firm*—Lewis H. Eslinger; Alvin Sinderbrand

[57] ABSTRACT

A programmable display device comprises a bar graph display panel having an anode, a series of spaced cathodes connected in groups representing respective phases and a reset cathode at one end of such series; and a scan control circuit for that display panel including a first programmable memory, such as, a PROM, having an output providing a clocking waveform representing a plurality of phase pulses and a reset pulse and being addressed to develop the phase pulses and reset pulse in a repeated cathode scanning cycle, a second programmable memory, desirably constituted by a plurality of PROMs and operated synchronously with the phase pulses for generating an analog ramp voltage of a slope and dynamic range determined by the second programmable memory, a comparator comparing the ramp voltage with a d.c. voltage characteristic of level of an audio or other signal to be displayed and providing a comparison output for energizing the anode in each cathode scanning cycle for an interval thereof in which such d.c. voltage exceeds the ramp voltage, and a circuit by which the phase pulses and reset pulse are applied to the series of cathodes in each cathode scanning cycle to provide a glow in the panel during energizing of the anode, with such glow occurring over a length of the panel representing the signal level to be displayed. Desirably, the first programmable memory may cause repetitive pulses in one of the phases so that an intensified segment is provided at a selected location along the glow on the display panel.

8 Claims, 4 Drawing Figures

| LOCATION | BIT 0 | BIT 1 | BIT 2 | BIT 3 | COMMENTS |
|---|---|---|---|---|---|
| $000_{10}$ | 0 | 0 | 0 | 0 | INITIAL STATE |
| $001_{10}$ | 1 | 0 | 0 | 0 | RESET (START) |
| $002_{10}$ | 0 | 1 | 0 | 0 | PHASE 1 (SEG.1) |
| $003_{10}$ | 0 | 0 | 1 | 0 | PHASE 2 (SEG.2) |
| $004_{10}$ | 0 | 0 | 0 | 1 | PHASE 3 (SEG.3) |
| $005_{10}$ | 0 | 0 | 0 | 1 | PHASE 3 (SEG.3) |
| $006_{10}$ | 0 | 0 | 0 | 1 | PHASE 3 (SEG.3) |
| $007_{10}$ | 0 | 0 | 0 | 1 | PHASE 3 (SEG.3) |
| $008_{10}$ | 0 | 0 | 0 | 1 | PHASE 3 (SEG.3) |
| $009_{10}$ | 0 | 1 | 0 | 0 | PHASE 1 (SEG.4) |
| 010 | 0 | 0 | 1 | 0 | PHASE 2 (SEG.5) |

PROGRAMMABLE SCAN CONTROL CIRCUIT FOR PROVIDING BAR GRAPH DISPLAY PANEL WITH SELECTED SCALES AND MARKER BARS

BACKGROUND OF THE INVENTION

1. Field of the Invention

This invention relates generally to bar graph display panels, and more particularly is directed to an improved control circuit therefor.

2. Description of the Prior Art

In order to display the level of an audio signal one well-known device now in use is referred to as a "bar graph". One such bar graph is manufactured by the Burroughs Corporation of Detroit, Mich. and is described in U.S. Pat. No. 3,973,166 issued Aug. 3, 1976 and entitled Display Panel for Displaying Bars of Light. As shown in the aforementioned patent, the bar graph display panel utilizes a gas-filled envelope containing a series of fine, closely-spaced cathode lines or elements connected in groups so that they can be energized sequentially and individually. The panel also includes an anode film aligned with the series of cathode lines and the panel contains ionizable gas. The display segments in such a panel are illuminated by a glow transfer principle. The glow is first established at a reset cathode and then transferred sequentially up to the desired height at a rate of approximately 60 cps, a rate at which a substantially flicker-free display is obtained. When the panel is energized, keep-alive electrodes connected to the power source provide excited particles for the reset cathode so that a glow discharge at the reset cathode is established to provide a visual display of analog signals. The height of the glow is determined in each scan by comparing a d.c. voltage representing the signal to be measured to an analog ramp voltage using a comparator the output of which is connected to the display panel anode such that when the d.c. voltage is the same or less than the ramp voltage, the anode voltage decreases below the ionization voltage and the loss of ionization voltage extinguishes the glow for the remainder of the scan.

Although the aforementioned bar graph and similar devices have been available for some time, various limitations have restricted their widespread use in the metering of signal levels. One basic limitation has been that the electronic circuits available for driving such a bar graph display panel have not been adequate. Such electronic circuits utilized a ramp generated by an R.C. network and such circuits did not permit intensified or brightened segments or what is referred to as "marker bars" to be obtained. Marker bars for such panels have been obtained but only by adding additional timing and clocking elements imposing further limitations in that such marker bars can be moved on the panel scale only by complex circuit changes.

It has long been sought to provide two level display utilizing such bar graphs if the bar graph display panel could be provided with several scales with different marker bar points and different available ranges. For example, if a display of the conventional European "Peak" scale per DIN is to be provided, a display from −40 db to +6 dB is desired with the dB steps in equally spaced increments and marker bars for each 10 dB is required. To display the American V.U. scale, the panel would have to be provided with a logarithmic scale from −20 dB to +3 dB with minus 10, −5, −3, 0, 1, 2 and 3 dB marker bars.

The following patents are representative of the prior art pertinent to the subject matter of this invention and all of which are clearly distinguishable from applicant's invention both structurally and functionally:

3,967,158 Saxon
4,001,555 Levis et al.
4,001,557 Stephenson

The Saxon patent utilizes a bar graph of the type described above in which an analog signal (to be displayed as a bar of light) and a ramp signal are coupled to a comparator the output of which energizes the anode electrode in the display panel. The cathode lines in the panel are energized or scanned and caused to glow sequentially so that when the two input signals, that is, the analog signal and the ramp signal, are equal, the output of the comparator is zero and anode is de-energized with the time in the scanning cyle when this occurs determining the number of cathodes which have been energized and the length of the bar of light displayed thereby. The basic concept in the Saxon patent is incorporated in bar graph display panels to which the applicant's invention is desirably applied but applicant's invention is directed specifically to a new and novel scan control circuit by means of which programmable memories (PROMs) are utilized for generating a reference ramp and for generating "marker bars" (intensified segments) at predefined positions on the bar graph display together with a circuit by means of which the ramp is generated in synchronism with the scanning of the cathodes in the display panel. The Stephenson patent relates to a digital process control function generator wherein a timing clock in combination with programmable read only memories controls variables in a process with respect to time. The Levis et al. patent relates to a signal processing apparatus for weighting an input signal in accordance with a mathematical transfer function to provide an output signal from the input signal as weighted by the function.

OBJECTS AND SUMMARY OF THE INVENTION

Accordingly, a primary object of this invention is to provide a new and novel scan control circuit for a bar graph display panel which permits the generation of "marker bars" or intensified segments at predefined positions on the bar graph display.

Another object of this invention is to provide a new and novel control circuit for a bar graph display panel which utilizes a programmable memory for predetermining the scanning cycle in a simple and easy manner.

A further object of this invention is to provide a new and novel control circuit for a bar graph display panel by means of which a reference ramp of predetermined slope and dynamic range is easily obtained.

Still another object of this invention is to provide a new and novel scan control circuit for a bar graph display panel wherein a reference ramp for matching any scale may be easily and simply obtained by a programming technique.

A still further object of this invention is to provide a new and novel scan control circuit for a bar graph display panel in which a reference ramp is generated in synchronism with the scanning of the display panel.

The above and other objects and advantages of the invention are accomplished by the provision of a control circuit for a bar graph display panel having an anode and a series spaced, cathode display elements connected in groups defining phases and a reset cathode at one end of such series. The circuit includes a programmable memory having an output for providing a clocking waveform including a plurality of phase pulses and a reset pulse with clocking means for addressing the programmable memory to develope the clocking waveform and the reset pulse. Means are provided for generating an analog ramp voltage of predetermined slope and dynamic range and comparator means are provided for comparing the ramp voltage to a d.c. voltage representing an audio program level to provide an output voltage for energizing said anode at a d.c. voltage which does not exceed the ramp voltage. Means are provided for applying the phase pulses to the plurality of cathodes in a cathode scanning cycle and for applying the reset pulse to the reset cathode to provide a glow in the bar graph display panel during the energization of the anode representative of the d.c. voltage.

Other objects and advantages will become apparent in the following specification when considered in light of the attached drawings.

BRIEF DESCRIPTION OF THE DRAWING FIGURES

DESCRIPTION OF THE PREFERRED EMBODIMENT

Figures 1, 4:
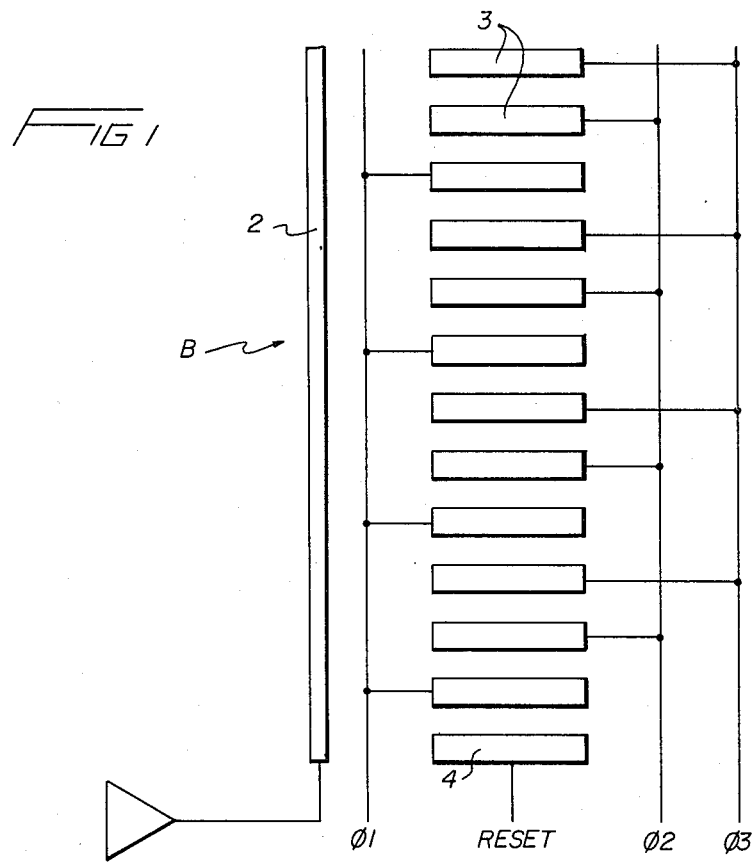
FIG. 1 is a schematic diagram of a portion of a bar graph display panel of a type to which the scan control circuit of the invention may be applied.
FIG. 4 is a table illustrating an example of the output from a PROM incorporated in the scan control circuit embodying the invention.
Figure 2:
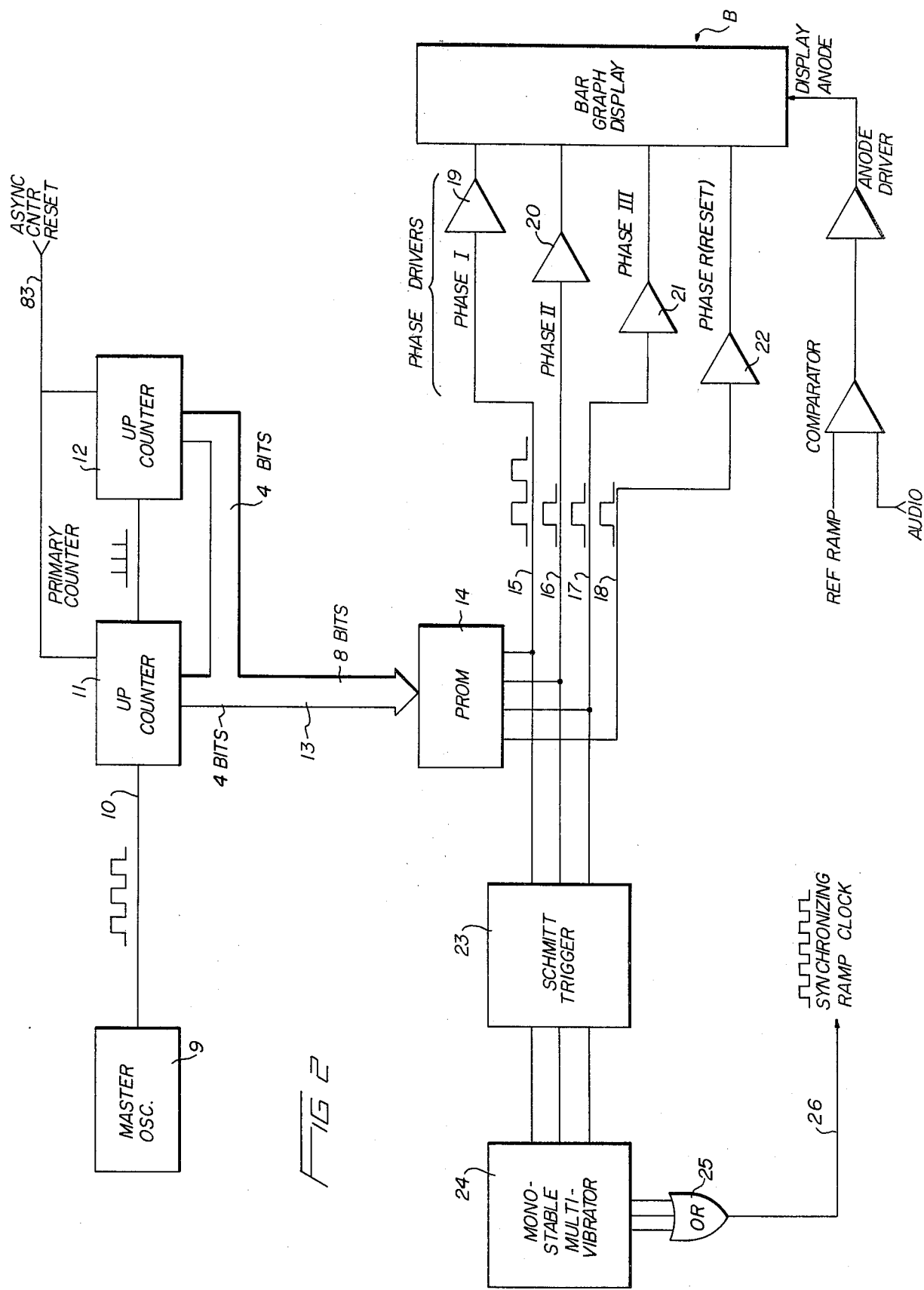
FIG. 2 is a schematic block diagram of a portion of the scan control circuit of the invention.
Figure 3:
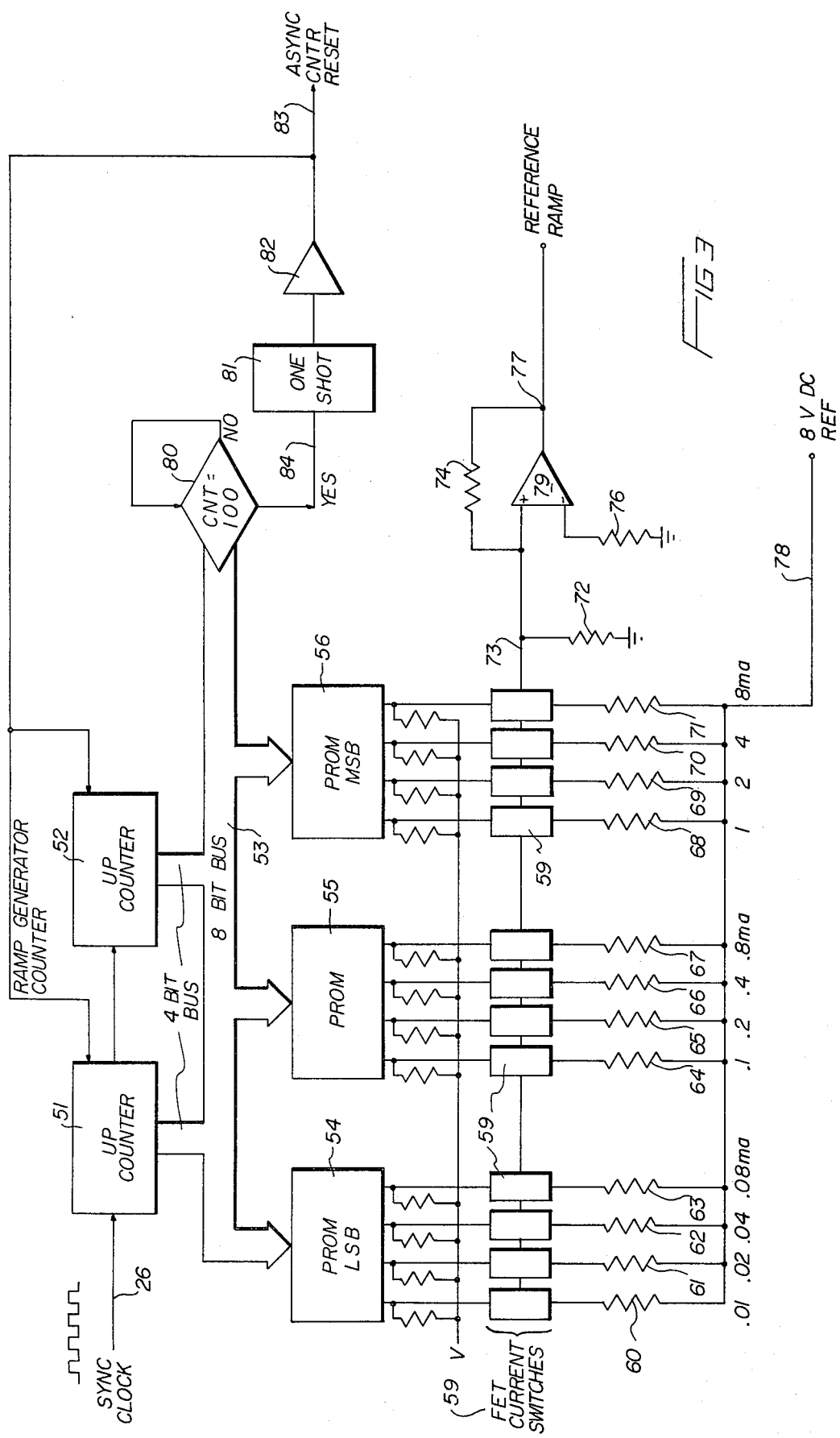
FIG. 3 is a schematic block diagram of another portion of the scan control circuit of the invention.

Referring to the drawings, FIGS. 2 and 3 together show in block diagram form the scan control circuit of the invention which is utilized in conjunction with a bar graph display panel of the type discribed in the aforementioned Saxon patent and which is of well-known construction being designated generally by the letter B. FIG. 1 shows schematically a portion of such a bar graph display panel which includes an anode 2, a plurality of cathodes or segments 3 arranged in vertically spaced relationship and divided into three groups (01, 02, and 03) and a reset cathode 4.

According to the present invention which is primarily useful for controlling the timing and scanning of self-scan bar graph displays, the output characteristics of the control circuit of the invention are determined only by the nature of the display desired. As will be explained hereinafter, the various memories used in the invention are programmed to produce additional dwell time on segments causing intensified marker bars and to produce any meter scaling (volts/inch, amp/inch, dB/inch, etc.), with any transfer function (log, linear, experimental, etc.).

Referring now to FIG. 2, the scan control circuit according to the invention is shown to include clocking means comprising a master oscillator 9 providing a clocking pulse on a line 10 for clocking two four-bit binary counters 11,12. Both of the counters 11, 12 are up counters the outputs of which are combined to form an eight-bit address bus 13 connected directly to the address inputs of a programmable memory or PROM 14.

The PROM 14 has the capability of addressing $256_{10}$ locations. The four-bit output word of the PROM 14 is defined as follows:

$O_0$ (Output bit zero) provides a reset pulse on a line 18; a $O_1$ (Output bit one) provides a phase one pulse on line 15; a $O_2$ (Output bit two) provides a phase two pulse on a line 16; and $O_3$ (Output bit three) provides a phase three pulse on a line 17.

The PROM 14 is thus programmed in such a manner as to develop a three phase clocking waveform at its output together with the reset (start) or phases. For example, if five segments on the bar graph are to be scanned having the third segment as a marker bar a program as shown in FIG. 4 would be stored in PROM 14. The output phases and reset pulses on lines 15, 16, 17, 18 from PROM 14 are buffered by amplifiers 19, 20, 21, 22, respectively, which have their outputs connected to the groups $\phi_1$, $\phi_2$ and $\phi_3$ of cathodes 3 and to reset electrode 4, respectively, so as to drive the bar graph display B.

In order to generate a ramp synchronous to the scanning of the display B, it is necessary to utilize the PROM 14 output phase pulses excluding the reset pulse. To develop a clock responsive to the sequencing of the phases (scanning pulses), Schmitt triggers 23 are connected to the lines 15-17 in series with three respective monostable multivibrators 24. The outputs of the multivibrators 24 are gated through an OR gate 25 to produce a synchronizing ramp clock on line 26 which is applied to dual four-bit up counters 51, 52 of the ramp generator of FIG. 3.

The ramp generator counters 51, 52 count only the changes in the phase pulses (lines 15-17) ignoring clock cycles with repetitive pulses by means of which intensified segments or "marker bars" are produced. The dual four-bit binary ramp generator counters 51, 52 directly address a plurality of programmable memories or PROMs 54, 55, 56 on an eight-bit address bus 53 and the internal programming of the PROMs is tailored to a predetermined analog ramp. The four-bit output word format of each PROM 54-56 is predefined such that PROM 54 contains the least significant bits (LSB) and PROM 56 contains the most significant bits (MSB). The binary weighted values of the outputs of PROMs 54-56 in ascending order from left to right are 0.01, 0.02, 0.04, 0.08, 0.1, 0.2, 0.4, 0.8; and 1, 2, 4, 8 volts respectively.

The outputs of PROMs 54-56 are connected directly to the gates of individual FET current switches 59 and control the states of the respective FETs. The FET current switches 59 are referenced to a precision voltage source on a line 78 that is free from power line fluctuations and temperature variation and resistors 60-63, 64-67 and 68-71 are provided for connecting the line 78 to respective ones of the FETs 59. A current summing point 73 for the FETs 59 is loaded by a resistor 72 to minimize fluctuations and oscillations internal to an amplifier 79 by loss of gain if all FETs are off as shown, amplifier 79 is connected with a feedback resistor 74 and a biasing resistor 76 and acts to convert the current to a reference ramp voltage at the output 77 of the amplifier. As shown on FIG. 2, such reference ramp voltage is applied to one input of a comparator C which corresponds to the comparator 144 in the previously identified Saxon patent, and which receives the analog or audio signal to be displayed at the other input to the comparator. As in that Saxon patent, the comparison output of comparator C is applied through an anode driver D to the anode 2 of the bar graph display B.

In addition, as shown on FIG. 3, a comparator circuit including a binary counter 80 is connected to compare the binary output count of the counters 51,52 to a fixed decimal value of $100_{10}$. The output 84 of the comparator circuit is one-shotted with a mountable multivibrator 81 and buffered through an amplifier 82 to provide a reset signal on a line 83 for driving the reset inputs of the digital counters 11, 12 (FIG. 2) and ramp generator counters 51, 52 (FIG. 3). This digital comparator circuit including counter 80 determines when the scan has reached the top of the bar graph to reset the system for the next scan.

By clocking the ramp counters 51,52 from the changing phases (15–17) via the synchronizing ramp clock on line 26 and then using a 100 count counter 80 (determined by the number of segments in the display) to detect successful completion of the ramp count on counters 51,52, there are no circuit constraints on how many clock cycles can be used for a marker bar or how many marker bars can be used on a display.

While a particular embodiment of this invention has been illustrated and described, modifications thereof will occur to those skilled in the art. It is to be understood, therefore, that this invention is not to be limited to the exact details disclosed.

What is claimed is:

1. A programmable display device comprising a bar graph display panel having an anode and a series of spaced cathodes connected in groups defining phases and a reset cathode at one end of said series; and a scan control circuit for said panel including a first programmable memory means having an output for providing a clocking waveform including a plurality of phase pulses and a reset pulse, clocking means for addressing said first programmable memory means to develop said plurality of phase pulses and said reset pulse in a repeating cathode scanning cycle, means including second programmable memory means operated synchronously with said phase pulses for generating an analog ramp voltage of a slope and dynamic range determined by said second programmable memory means, comparator means for comparing said ramp voltage to a d.c. voltage representing an audio program level to provide an output voltage for energizing said anode in each said cathode scanning cycle for an interval thereof in which said d.c. voltage exceeds said ramp voltage, and means for applying said phase pulses and said reset pulse to said series of cathodes in each said cathode scanning cycle to provide a glow in said bar graph display panel during the energization of said anode with the length of such glow being representative of said d.c. voltage.

2. A programmable display device in accordance with claim 1; wherein said first programmable memory means provides said clocking waveform with repetitive pulses in a selected one of said phases to thereby provide an intensified segment at a selected location along said glow on said display panel.

3. A programmable display device in accordance with claim 2; wherein said first programmable memory means comprises a PROM.

4. A programmable display device in accordance with claim 3; wherein three phase pulses and a reset pulse are provided at the output of said PROM and wherein three of said groups of cathode elements are provided on said display panel and wherein said three phase pulses and said reset pulse are applied by said applying means sequentially to a respective one of said groups of cathode elements and initially to said reset cathode.

5. A programmable display device in accordance with claim 4; wherein said clocking means includes an oscillator having an output for providing a clocking pulse train, and first counting means having an input connected to said oscillator for counting said clocking pulse train, said counting means having an output for addressing said PROM and means for resetting said counting means.

6. A programmable display device in accordance with claim 5; wherein said resetting means are connected to means by which said second programmable memory means are operated synchronously with said phase pulses.

7. A programmable display device in accordance with claim 6; wherein said means for synchronously operating said second programmable memory means includes means connected to the output of said PROM for providing a synchronizing ramp clock in response to said three phases pulses; said second programmable memory means are connected to said synchronizing ramp clock; and further including means having a first output for providing said ramp voltage and a second output connected to said resetting means for providing a reset signal for said first counting means.

8. A programmable display device in accordance with claim 7; wherein said second programmable memory means includes a plurality of PROMs programmed to provide a predetermined ramp, second counting means having an input connected to said means providing the synchronizing ramp clock for addressing said plurality of PROMs, said plurality of PROMs having outputs of differing binary weighted values and connected together at a current summing point, and amplifier means having an input connected to said outputs of said plurality of PROMs at said current summing point for providing said ramp voltage.

* * * * *